(12) United States Patent
Bains et al.

(10) Patent No.: US 8,161,356 B2
(45) Date of Patent: Apr. 17, 2012

(54) SYSTEMS, METHODS, AND APPARATUSES TO SAVE MEMORY SELF-REFRESH POWER

(75) Inventors: Kuljit S. Bains, Olympia, WA (US); John Halbert, Beaverton, OR (US); Michael W. Williams, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 1055 days.

(21) Appl. No.: 12/058,076

(22) Filed: Mar. 28, 2008

(65) Prior Publication Data

US 2009/0249169 A1 Oct. 1, 2009

(51) Int. Cl.
*G06F 11/00* (2006.01)
(52) U.S. Cl. ......................... 714/766; 714/763
(58) Field of Classification Search .................. 714/766, 714/763, 807; 365/200, 230.03
See application file for complete search history.

(56) References Cited

U.S. PATENT DOCUMENTS

| | | | |
|---|---|---|---|
| 5,043,847 A * | 8/1991 | Deinhardt et al. | 361/736 |
| 5,315,557 A | 5/1994 | Kim et al. | |
| 7,257,763 B1 | 8/2007 | Srinivasan et al. | |
| 7,447,948 B2 * | 11/2008 | Galbi et al. | 714/701 |
| 7,734,985 B2 * | 6/2010 | Bains | 714/763 |
| 7,774,684 B2 * | 8/2010 | Bains | 714/766 |
| 2003/0058695 A1 | 3/2003 | Yoo | |
| 2005/0041501 A1 | 2/2005 | Tsern et al. | |
| 2005/0281112 A1 | 12/2005 | Ito et al. | |
| 2006/0053361 A1 * | 3/2006 | Kim | 714/766 |
| 2007/0079212 A1 | 4/2007 | Har-Chen et al. | |

FOREIGN PATENT DOCUMENTS

| | | |
|---|---|---|
| EP | 1215678 A2 | 6/2002 |
| EP | 1777624 A2 | 4/2007 |
| JP | 2004-126911 A | 4/2004 |
| JP | 2005-339074 A | 12/2005 |
| WO | 2009/121022 A2 | 10/2009 |
| WO | 2009/121022 A3 | 1/2010 |

OTHER PUBLICATIONS

Extended European Search Report for European Patent Application No. 09724975.9, mailed on Jul. 21, 2011, 7 pages.
International Search Report and Written Opinion for PCT Patent Application No. PCT/US2009/038670, mailed on Nov. 11, 2009, 13 pages.

* cited by examiner

*Primary Examiner* — Dieu-Minh Le
(74) *Attorney, Agent, or Firm* — Blakely, Sokoloff, Taylor & Zafman LLP

(57) ABSTRACT

Embodiments of the invention are generally directed to systems, methods, and apparatuses to save dynamic random access memory (DRAM) self-refresh power. In some embodiments, the refresh frequency of a DRAM is reduced and errors are allowed to occur. In error check mode, the DRAM stores data and corresponding error check bits. The error check bits may be used to scrub the memory and fix the errors.

24 Claims, 6 Drawing Sheets

SYSTEMS, METHODS, AND APPARATUSES TO SAVE MEMORY SELF-REFRESH POWER

TECHNICAL FIELD

Embodiments of the invention generally relate to the field of integrated circuits and, more particularly, to systems, methods and apparatuses to save dynamic random access memory (DRAM) self-refresh power.

BACKGROUND

Memory devices are susceptible to errors such as transient (or soft) errors. If these errors are not handled properly, they can cause a computing system to malfunction. Redundant information in the form of error correcting codes (ECCs) can be used to improve overall system reliability. The redundant information, however, increases the storage requirement of the memory system and, thereby, increases the cost of the memory system. Thus, ECC is typically only used on high-end or mission critical systems. Lower cost (or less critical) systems do not use ECC and provide a level of reliability which is appropriate to their usage.

In some cases, the extra bits of storage are added to the system by adding additional memory devices (e.g., dynamic random access memory (DRAM) devices). For example, a system using eight DRAMs to store data may also use an additional DRAM to store the check codes. In other cases, the extra bits are stored in a variant DRAM designed especially for use in ECC systems. For example, a non-ECC DRAM may have 256 Mbits of capacity and 16 outputs. The ECC variant of that DRAM may have 288 Mbits of capacity and 18 outputs. In both of these examples, the ECC systems have 12.5% more storage capacity than the non-ECC counterparts.

The use of different DRAM devices in ECC systems has a number of disadvantages. For example, there is an increase in costs associated with designing, manufacturing, and inventorying, two (or more) variants of a DRAM device. In addition, an ECC variant DRAM device is larger than its non-ECC counterpart and, therefore, more difficult to manufacture. Adding the extra bits to the ECC variant DRAM lowers the yield of devices and, thus, increases the cost of the devices. Another disadvantage of using two (or more) variants of a DRAM device is that memory controllers that interface with the DRAM devices are required to support additional pins (e.g., ECC pins). Also, an ECC variant DRAM module uses more space on a motherboard because its connector is larger than its non-ECC counterpart.

Each memory cell in a DRAM is constructed from a single transistor and a single capacitor and is called dynamic because its data decays and becomes invalid due to various leakage current paths to surrounding cells and to the substrate. To keep the data in the cells valid, each memory cell is periodically refreshed. Data in the DRAM cell array is refreshed every time it is read out of the cell array into the sense amplifiers and subsequently rewritten into the cell.

The memory controller is responsible for periodically performing refresh maintenance operations on the memory cell array. Every row of the memory array needs to be refreshed before the data in the row decays to an invalid state. In a low power mode, the DRAM is placed in a self-refresh state where the DRAM is responsible for performing the refreshes. As DRAM densities increase over time, the trend is to have more rows of memory, which in turn will increase the refresh overhead and refresh power.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to systems, methods, and apparatuses to save dynamic random access memory (DRAM) self-refresh power. In some embodiments, a memory device includes at least one split bank pair that has a first memory bank and a second memory bank. In the error check mode, data bits may be stored in one of the memory banks and the corresponding error check bits are stored in the other memory bank. The memory device may be configured to support either mode using, for example, a register bit (such as a mode register set (MRS) register bit). The memory device may also include error correction logic.

In some embodiments, the power consumed by a DRAM is reduced by reducing the self-refresh frequency and, thereby, reducing the self-refresh current. The reduced self-refresh frequency may allow errors to occur in the data stored in the DRAM. As is further described below, the error bits stored in the DRAM may be used to scrub the data and fix the errors.

Figure 1:
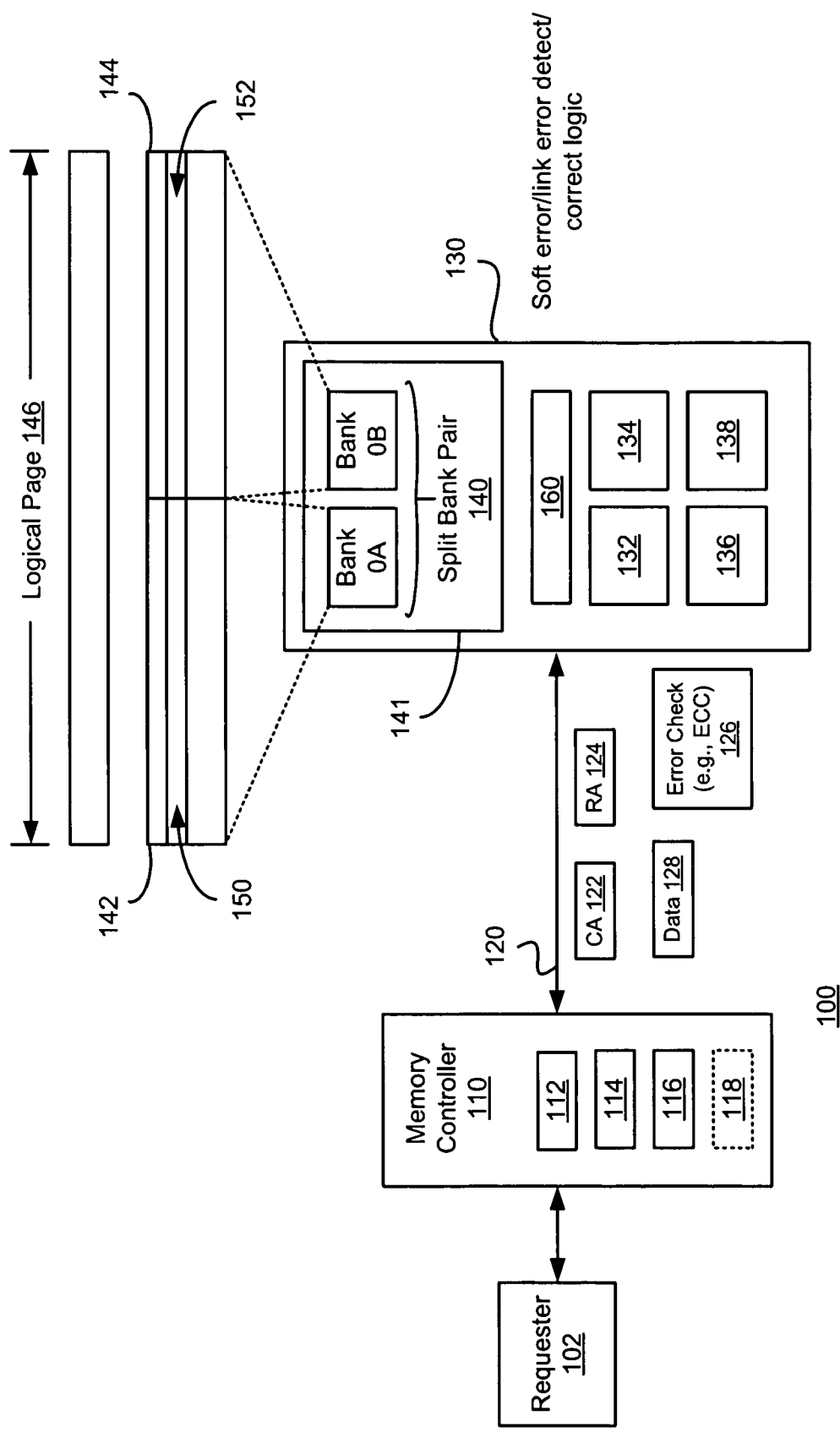
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. Computing system 100 includes requester 102, memory controller (or host) 110, memory device 130, and interconnect 120. Memory controller 110 controls, at least in part, the transfer of information between requester 102 and memory device 130. Requester 102 may be a processor (e.g., a central processing unit and/or a core), a graphics processor, a service processor, an input/output device (e.g., a peripheral component interconnect (PCI) Express device), memory itself, or any other element of system 100 that requests access to memory. In some embodiments, memory controller 110 is on the same die as requester 102.

In the illustrated embodiment, memory controller 110 includes error check logic 112, mode indicator 114, and memory device addressing logic 116. Error check logic 112 uses redundant information to protect data from specified faults. In some embodiments, error check logic 112 is an error correction code (ECC).

As is further discussed below, in some embodiments, memory device 130 can operate in either an error check mode or a non-error check mode. When operating in an error check mode, memory device 130 stores both data bits and corresponding error check bits (e.g., ECC bits). When operating in a non-error check mode, (substantially) the entire capacity of memory device 130 is used to store data bits. Mode indicator 114 provides an indication of whether memory device 130 is operating in an error check mode or a non-error check mode. In some embodiments, mode indicator 114 includes one or more register bits.

In some embodiments, memory device 130 applies a different address mapping for read/write data depending on whether it is in the error check mode or the non-error check mode. For example, the address mapping used in the error check mode may account for the mapping of error check bits (e.g., ECC bits). Address mapping logic 116 enables memory controller 110 to be aware of the address mapping used by memory device 130. Address mapping logic 116 may be any logic capable of providing an indication of address mapping for a number of memory locations.

In some embodiments, memory controller 110 includes self-refresh frequency control logic 118. As is further described below, control logic 118 is an optional element that may dynamically control the self-refresh frequency of memory device 130. Memory device 130 may provide an indication to control logic 118 of the error rate and/or type of errors that occur during self-fresh. Control logic 118 may then increase or decrease the self-refresh frequency of memory device 130. For example, if too many errors (or certain kinds of errors) occur, then control logic 118 may increase the self-refresh frequency. Similarly, if the error rate is lower than the system can tolerate, then control logic 118 may decrease the self-refresh frequency.

Memory device 130 may be any of a wide range of devices including a dynamic random access memory device (or, simply, a DRAM). Memory core 141 may be organized into one or more split bank pairs 140. A split bank pair refers to a pair of memory banks that can be configured as either a single bank or as two separate banks. In some embodiments, each bank of the split bank pair has its own row decoder and column decoder.

In some embodiments, each bank of the split bank pair can provide a page of memory. For example, bank 0A provides page 142 and bank 0B provides page 144. A "bank" refers to an array of memory locations provided by a memory device. Collectively, banks 142 and 144 can provide logical page 146. The term "logical page" refers to a logical combination of two or more physical banks. In some embodiments, pages 142 and 144 each provide 1 kilobytes (K bytes) of memory and logical page 146 provides a net effective page size of 2K bytes.

In the illustrated embodiment, memory device 130 includes mode indicator 132, Refresh logic 134, partial write mask 136, and column address generation logic 138. Mode indicator 132 provides an indication of whether memory device 130 is operating in an error check mode or a non-error check mode. In some embodiments, mode indicator 132 includes one or more bits of a register such as a mode register set (MRS). Refresh logic 134 provides logic to enable memory device 130 to perform self-refresh activities. For example, refresh logic 134 may include an oscillator, a column address counter, and the like.

Partial write mask 136 provides a write mask for data that is written to the memory core. In some embodiments, partial write mask 136 is used to access error check bits associated with data stored in memory device 130. In some embodiments, column address generation logic 138 generates column address information for error check bits associated with data stored in memory device 130.

Memory device 130 may also include on-die error correction logic 160. In some embodiments, error correction logic 160 enhances the reliability, availability, and serviceability (RAS) of memory device 130 when it is operating in the error check mode. More particularly, in some embodiments, error correction logic 160 enables memory device 130 to scrub the errors that may occur in stored data when the self-refresh rate is lowered to save power. In some embodiments, error correction logic 160 includes ECC computation logic and comparison logic. This computation and comparison logic enables the device to locally compute ECC bits for read data and to compare the locally computed ECC bits with stored ECC bits (or host generated ECC bits). If the locally computed ECC bits do not match the host generated ECC bits, then logic 160 may correct the errors that are detected. In some embodiments, logic 160 implements a Hamming code. In other embodiments, a different error detection/correction code may be used.

Figure 2:
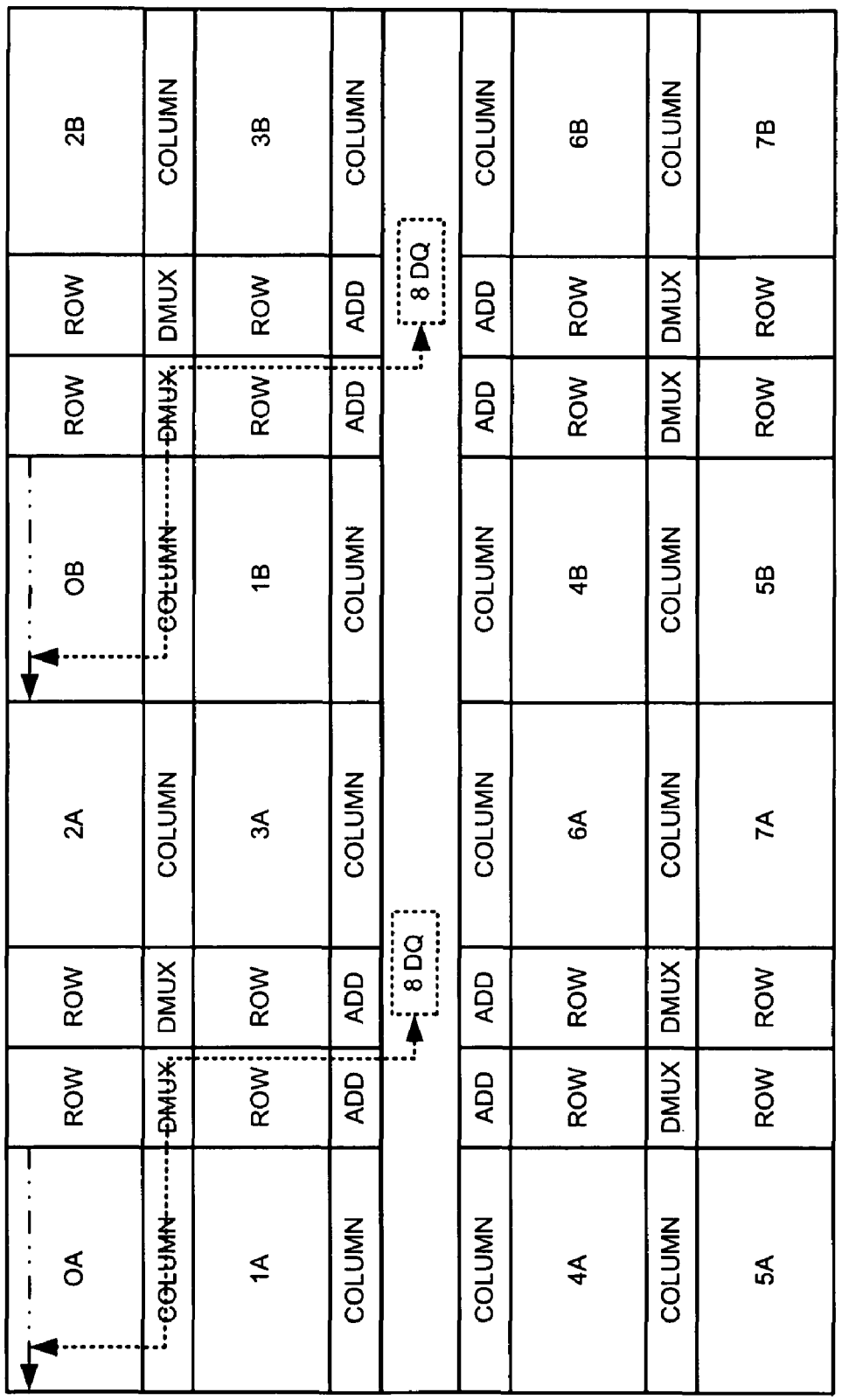
FIG. 2 is a block diagram illustrating selected aspects of a dynamic random access memory (DRAM) implemented according to an embodiment of the invention.

FIG. 2 is a block diagram illustrating selected aspects of a dynamic random access memory (DRAM) implemented according to an embodiment of the invention. DRAM 200 includes 16 memory banks (0A through 7B) or 8 split bank pairs (e.g., split bank pair 0A, 0B). In some embodiments, DRAM 200 can be configured as either a x4/x8 or a x16 DRAM. In x4/x8 mode, DRAM 200 provides 16 banks (0A through 7B) and each bank provides 32/64 bits of data to 4/8 data (DQ) pins. In x16 mode, DRAM 200 provides 8 split bank pairs to provide 128 bits of data to 16 DQ pins. In alternative embodiments, DRAM 200 may include a different number of banks which may provide a different number of bits.

In some embodiments, DRAM 200 can be configured to operate in either an error check mode (e.g., an ECC mode) or a non-error check mode. When operating in an error check mode, DRAM 200 leverages its split bank architecture by storing data in one member of the split bank (e.g., bank 0A) and corresponding error check bits (e.g., ECC bits) in the other member of the split bank (e.g., bank 0B). The bank pairs selected in the error check mode are the same as the ones used to implement a x16 device although error check mode is implemented in x4/x8 devices in some embodiments of the invention. Thus, in the error check mode, the number of bank resources (and bank groups) is reduced by half and the page size is effectively doubled to 2K.

Figure 3:
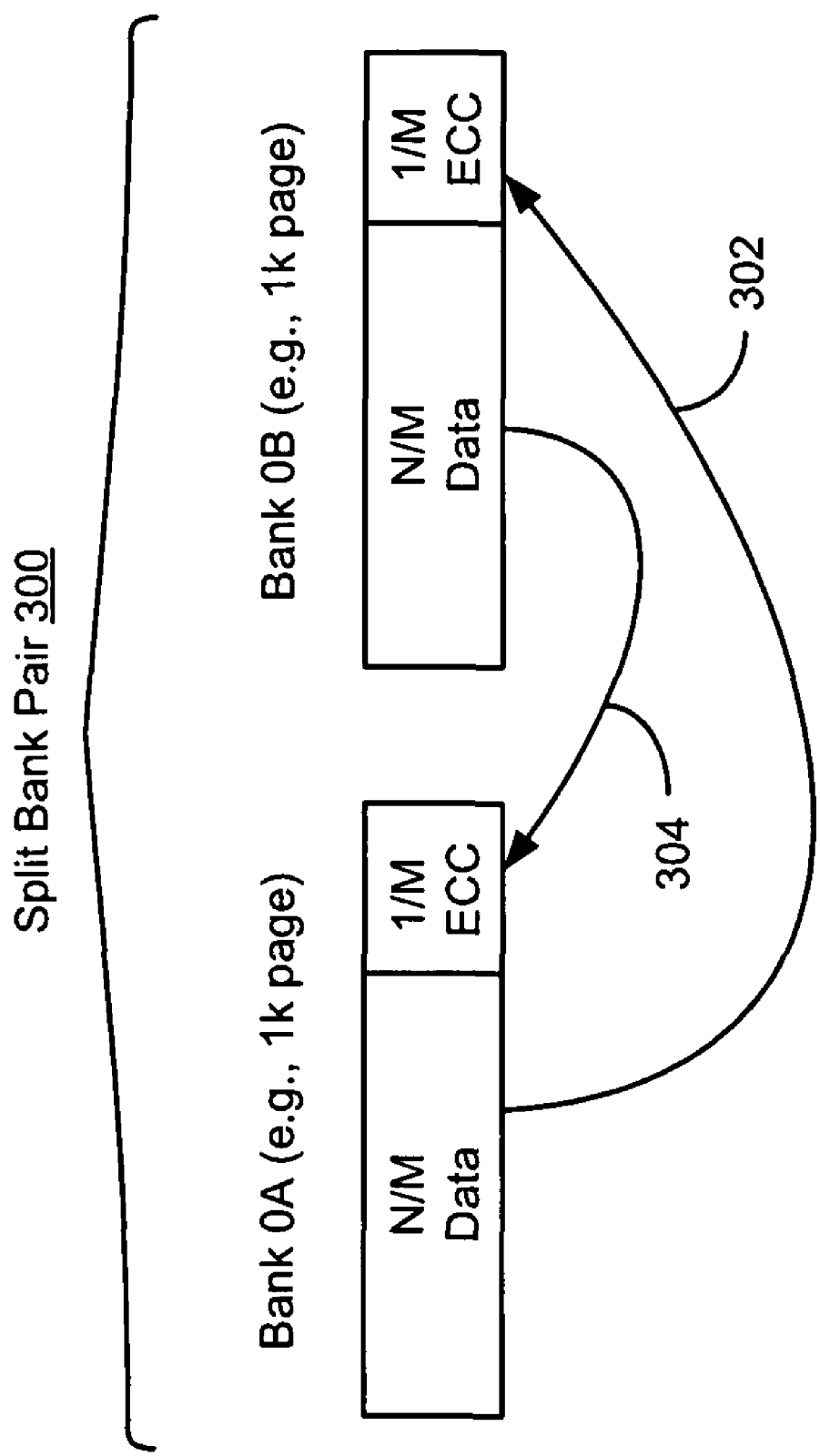
FIG. 3 is a block diagram illustrating selected aspects of a dynamic random access memory (DRAM) implemented according to an embodiment of the invention.

FIG. 3 is a block diagram illustrating selected aspects of storing data bits and error check bits in a split bank pair, according to an embodiment of the invention. Split bank pair 300 includes bank 0A and bank 0B. In some embodiments, data is stored in up to N/Mths (e.g., ⅞ths) of the locations in each bank and corresponding error check bits are stored in the last 1/Mth (e.g., ⅛) of the other member of split bank pair 300. For example, the error check bits covering the data stored in bank 0A may be stored in the top ⅛th of the memory locations of bank 0B (302). Similarly, the error check bits covering the data stored in bank 0B may be stored in the top ⅛th of the memory locations of bank 0A (304). In some embodiments, the error check bits are error check code (ECC) bits.

In some embodiments, a host (e.g., memory controller 110, shown in FIG. 1) addresses a specific bank in the split bank pair to identify the bank that is receiving/providing the data bits. If the memory device is in the error check mode, then it uses its internal logic (e.g., partial write mask 136, column address generation logic 138, etc., shown in FIG. 1) to access the error check bits corresponding to the data bits. Accessing data bits and corresponding error check bits is further discussed below with reference to FIGS. 4-6.

Figure 4:
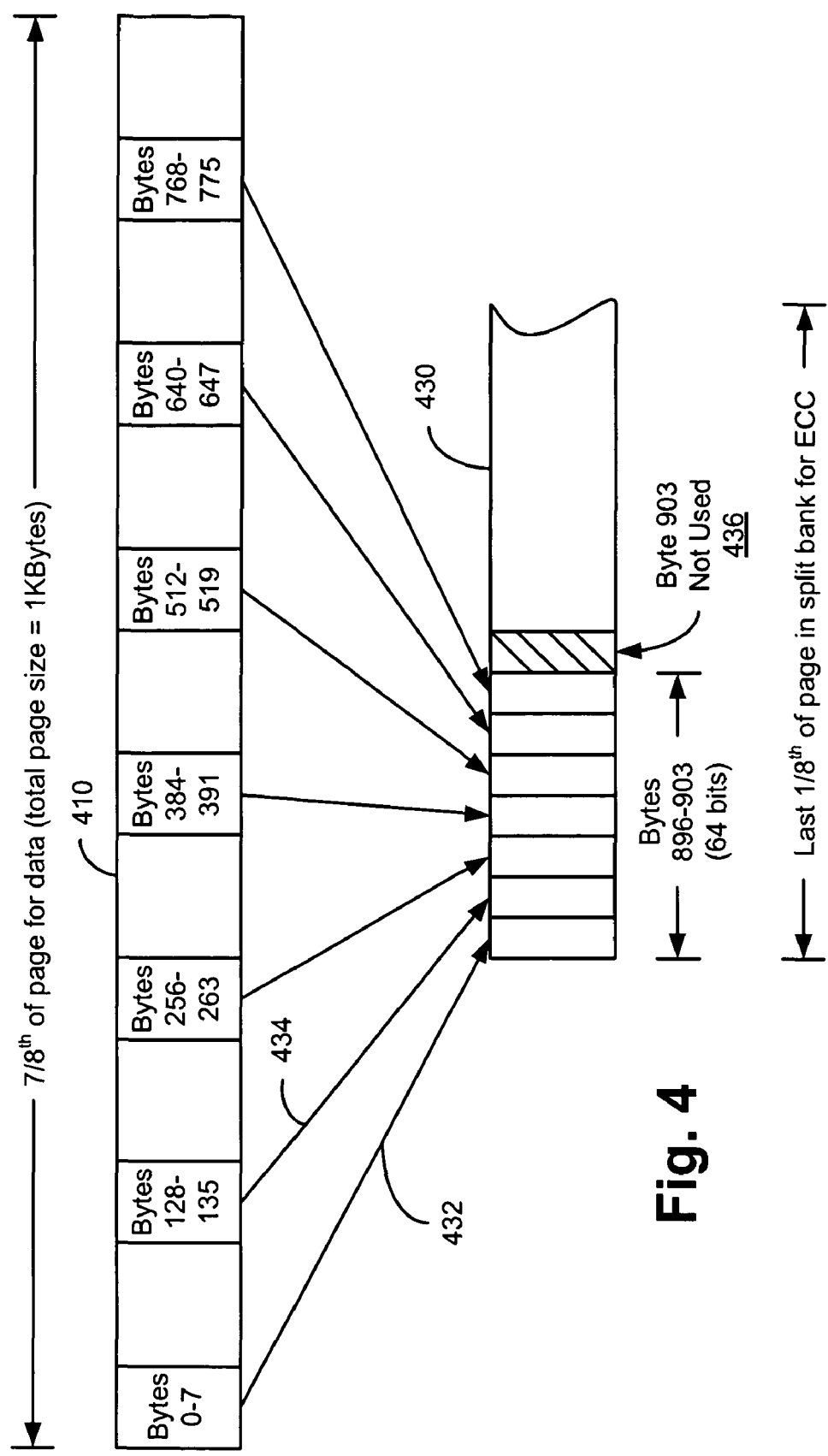
FIG. 4 is a diagram illustrating an example of the address mapping between data bits and error check bits, according to an embodiment of the invention.

FIG. 4 is a diagram illustrating an example of the address mapping between data bits and error check bits, according to an embodiment of the invention. In the illustrated embodiment, the data bits are stored in ⅞ths of a page that is provided by a bank within a split pair of banks as shown by 410. The corresponding error check bits are stored in the upper ⅛th of the other bank in the split bank pair (430). For example, the ECC bits covering bytes 0-7 are stored at memory location 896 as shown by reference number 432. Similarly, the ECC bits covering bytes 128-135 are stored at memory location 897 as shown by reference number 434 and this pattern is continued for the data bytes in page 410 as shown in FIG. 4. In some embodiments, the last byte of the upper ⅛th of bank 430 (e.g., location 903) is not used as shown by reference number 436. In some embodiments, the error check bits covering bytes 8-15 are stored in location 905 and the sequence repeats itself.

Figure 5:
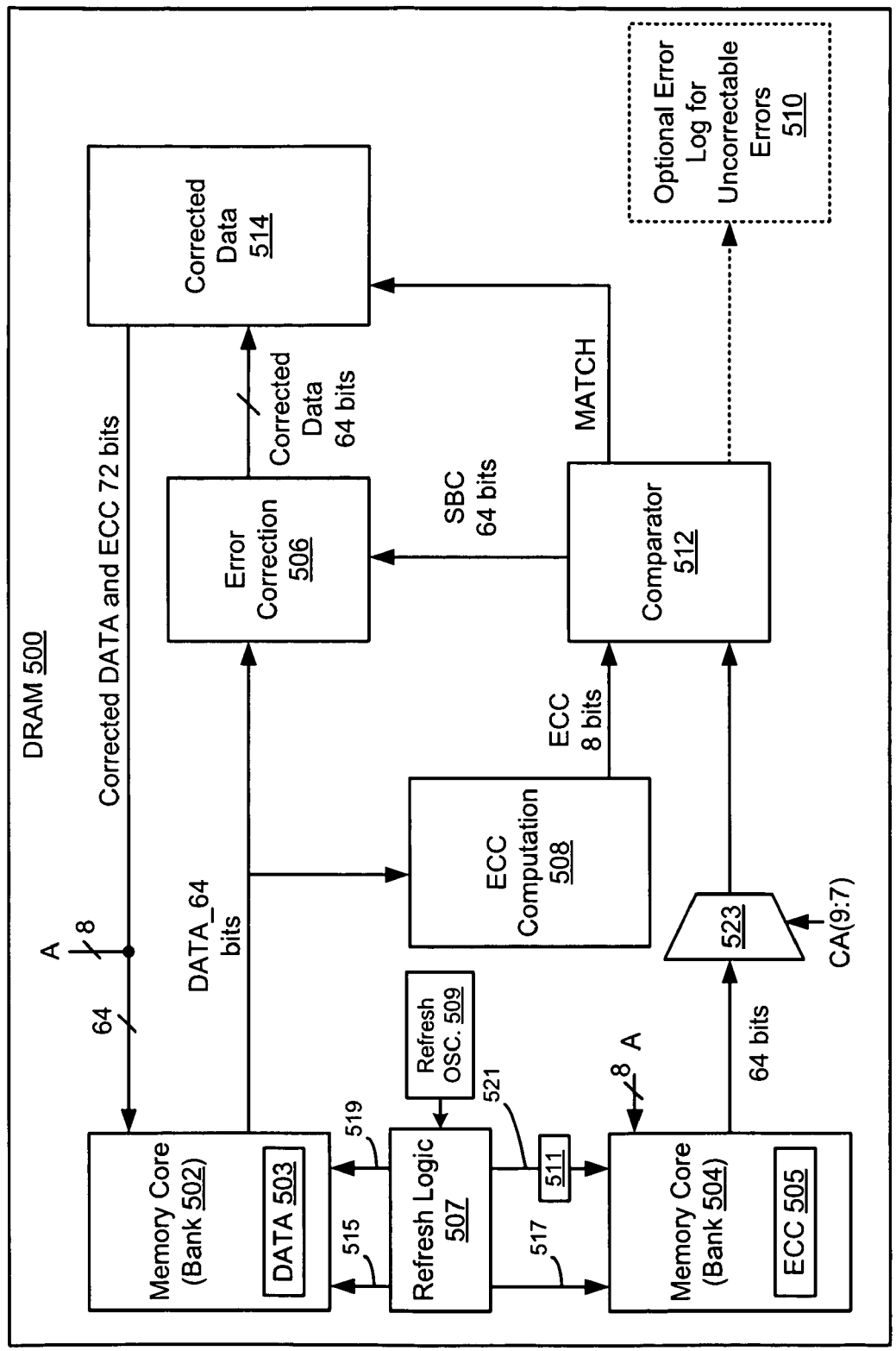
FIG. 5 is a block diagram illustrating selected aspects of on-die error correction logic to scrub errors in memory during self-refresh, according to an embodiment of the invention.

FIG. 5 is a block diagram illustrating selected aspects of power savings during self-refresh, according to an embodiment of the invention. In some embodiments, memory device 500 (e.g., a DRAM) includes, inter alia, a memory core (502 and 504), refresh logic 507, and a number of elements to support saving power by reducing the self-refresh frequency of DRAM 500. In some embodiments, the elements shown in FIG. 5 are integrated onto a common chip. Bank 502 and bank 504 may each be a split bank in a split bank pair. The memory core may include multiple split bank pairs. Data bits 503 are stored in bank 502 and corresponding ECC bits 505 are stored in bank 504. In some embodiments, ECC bits 505 are computed by a host (e.g., memory controller 110, shown in FIG. 1) and provided to memory device 500 in a write data frame.

Refresh logic 507 ensures the data integrity of DRAM 500 by periodically performing refresh operations when DRAM 500 is in a self-refresh mode. Refresh logic 507 may include logic to generate row addresses as well as an address counter to step through the columns of each open row. In some embodiments, the stride of the step is 64 bits. Refresh logic 507 provides the row addresses to the memory core via lines 515 and 517. The column address information is conveyed via lines 519 and 521. Masking logic 511 masks some of the bits of the column address (e.g., the three most significant bits) so that the upper 1/Mth (e.g., upper ⅛$^{th}$) of bank 504 is accessed to reach error check bits 505.

Oscillator 509 determines the refresh frequency. In some embodiments, the refresh frequency is selected based on a tradeoff between power savings and the error budget that DRAM 500 can support. For example, the selected refresh frequency may be low enough that errors in the stored data may occur. As is further described below, these errors may be detected and corrected by, for example, comparator 512 and error correction logic 506. In some embodiments, the refresh frequency may be dynamically set based on the number of errors that are occurring during self-refresh (e.g., as tracked by logic 510). In alternative embodiments, the self-refresh frequency may be static.

In the illustrated embodiment, DRAM 500 includes ECC correction logic 506, ECC computation logic 508, comparator 512, and (optionally) error tracking logic 510. ECC computation logic 508 computes ECC bits to cover data 503. In some embodiments, logic 508 uses the same polynomial to compute the ECC bits as was used to compute ECC bits 505. For example, logic 508 may use the same polynomial as error check logic 112, shown in FIG. 1. Logic 508 may use almost any error correction code polynomial. In the illustrated embodiment, logic 508 computes 8 ECC bits to cover 64 data bits. In alternative embodiments, the number of ECC bits and/or data bits may be different.

Comparator 512 compares the computed ECC bits (e.g., locally generated ECC bits) with the stored ECC bits (e.g., host generated ECC bits such as ECC bits 505). If the two sets of ECC bits match, then comparator 512 asserts a MATCH signal. If the computed ECC bits do not match the stored ECC bits, then data bits 503 may contain an error. In some embodiments, DRAM 500 includes ECC correction logic 506 to correct certain errors. In such embodiments, if the two sets of ECC bits do not match, then comparator 512 may provide data (e.g., an indication of which ECC bits failed to match) to ECC correction logic 506 so that it can correct the problem. In some embodiments, logic 506 includes single bit correct logic and SBC denotes the signal bit that needs to be corrected out of, for example, 64 bits. Comparator 512 may assert an error signal if it detects an error having a weight that logic 506 cannot correct. For example, comparator 512 may assert the error signal if it detects a double bit error. Comparator 512 may be any logic suitable for comparing one set of bits to another and asserting one or more signals in response to the comparison.

In some embodiments, DRAM 500 includes optional error tracking logic 510. Logic 510 tracks errors that are detected during self-refresh. Logic 510 may store a log of the errors. In some embodiments, logic 510 conveys information about the detected errors to the host (e.g., host 110, shown in FIG. 1) so that the host can adjust the self-refresh frequency (e.g., by adjusting oscillator 509). In alternative embodiments, logic 510 provides a control signal to oscillator 509 to adjust the self-refresh frequency.

As discussed above, ECC correction logic 506 includes logic to correct certain kinds of errors (e.g., single bit errors). In some embodiments, logic 506 receives data bits 503 and the SBC data as inputs and outputs corrected data. If no error is detected, then data bits 503 may simply flow through ECC correction logic 506. Corrected data 514 returns the data to the memory core.

Figure 6:
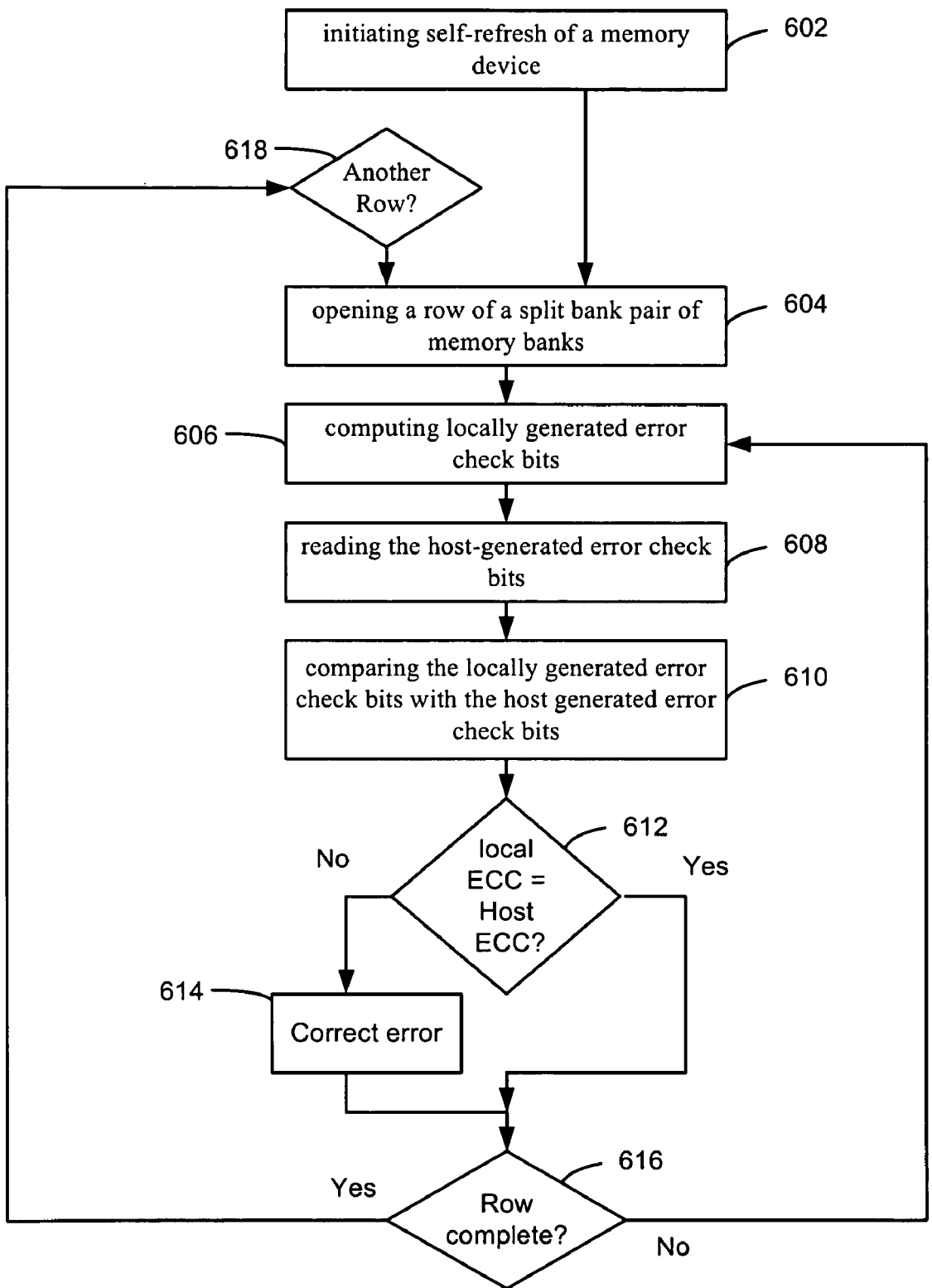
FIG. 6 is a flow diagram illustrating selected aspects of saving power, while operating in self-refresh, according to an embodiment of the invention.

FIG. 6 is a flow diagram illustrating selected aspects of saving power, while operating in self-refresh according to an embodiment of the invention. Referring to process block 602, a host (e.g., host 110 shown in FIG. 1) enters a low power state and instructs a DRAM to initiate a self-refresh. The DRAM's refresh logic (e.g., logic 507, shown in FIG. 5) opens the same row in each bank of a split bank pair using the same row address (604). In some embodiments, the refresh logic includes a column address counter to generate the column addresses. The column address counter may access 64 bits of data from the bank that is storing the data bits (e.g., bank 502, shown in FIG. 5). In some embodiments, the column address counter is a seven bit counter that provides column address bits CA9-CA3.

Referring to process block 606, ECC computation logic (e.g., ECC computation logic 508, shown in FIG. 5) computes locally generated error check bits. In some embodiments, the ECC computation logic uses an industry standard mechanism such as a Hamming code to generate the error check bits. The locally generated error check bits and the host generated error check bits should be generated using an equivalent polynomial.

Referring to process block 608, the host generated error check bits are read (e.g., from bank 504, shown in FIG. 5). In some embodiments, the DRAM includes logic to mask a portion of the column address when addressing the bank in which the host generated error bits are stored (e.g., logic 511, shown in FIG. 5). For example, the upper three bits (CA9-CA7) may be forced to "111" to fetch 64 bits of data from the last ⅛$^{th}$ of the page. In some embodiments, the actual value of CA9-CA7 is used to select one of the 64 bytes (e.g., using multiplexer 523, shown in FIG. 5). The selected byte is the one that contains the error check bits corresponding to the data.

Referring to process block 610, the locally generated error check bits are compared with the host generated error check bits. If the error check bits match, then there is no error in the data. If the error check bits do not match, then error correction logic (e.g., error correction logic 506, shown in FIG. 5) may correct the error. In either case the data is written back to memory (e.g., via corrected data block 514). This process may continue until the entire row is refreshed as shown by 616. The refresh logic selects the next row to refresh at 618. The process may continue until the entire array (or a selected portion of the array) is refreshed.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. A memory device comprising:
    a split bank pair of memory banks including a first memory bank and a second memory bank wherein data is to be stored in the first memory bank and corresponding host generated error check bits are to be stored in the second memory bank, if the memory device is in an error check mode;
    error check logic to receive the data from the first memory bank and to generate locally generated error check bits based on the data, if the memory device is in self-refresh mode; and
    a comparator to compare the host generated error check bits with the locally generated error check bits.

2. The memory device of claim 1, further comprising:
    an oscillator to control a self-refresh frequency, wherein the self-refresh frequency is selected, at least in part, to allow single bit errors in the data.

3. The memory device of claim 2, further comprising:
    error tracking logic to track errors in the data and to provide error information.

4. The memory device of claim 3, wherein the oscillator dynamically controls the self-refresh frequency based, at least in part, on the error information.

5. The memory device of claim 3, wherein the error tracking logic is to provide error information to a host.

6. The memory device of claim 5, wherein the oscillator dynamically controls the self-refresh frequency based, at least in part, on input from the host.

7. The memory device of claim 2, further comprising:
    error correction logic to correct an error in the data if the host generated error check bits do not match the locally generated error check bits.

8. The memory device of claim 7, further comprising:
    write logic to write corrected data to a memory core.

9. The memory device of claim 1, further comprising:
    column address masking logic to provide a column address for the host generated error check bits to be stored in the second memory bank.

10. A method comprising:
    opening a row of a split bank pair of memory banks, the split bank pair including a first memory bank and a second memory bank wherein data is stored in the first memory bank and corresponding host generated error check bits are stored in the second memory bank, if an associated memory device is in an error check mode;
    computing locally generated error check bits using error check logic located on the same integrated circuit as the split bank pair;
    reading the host generated error check bits from the second memory bank;
    comparing the locally generated error check bits with the host generated error check bits;
    providing the data to error correction logic, if the locally generated error bits do not match the host generated error check bits; and
    initiating self-refresh of a memory device, wherein a self-refresh frequency is set low enough to allow single bit errors in data to occur.

11. The method of claim 10, wherein opening the row of the split bank pair of memory banks comprises:
    opening the row of the split bank pair of memory banks using the same row address.

12. The method of claim 10, wherein reading the host generated error check bits from the second memory bank comprises:

reading n bits of data from the second memory bank using a column address, wherein m bits of the column address are masked; and selecting o bits from the n bits based, at least in part, on the m bits of the column address.

13. The method of claim 10, wherein opening the row of the split bank pair of memory banks comprises:

opening the row of the split bank pair of memory banks responsive to initiating self-refresh of the memory device.

14. A system comprising:

a host to transfer data; and a memory device coupled with the host, the memory device including, a split bank pair of memory banks including a first memory bank and a second memory bank wherein data is to be stored in the first memory bank and corresponding host generated error check bits are to be stored in the second memory bank, if the memory device is in an error check mode;

error correction logic to receive the data from the first memory bank and to generate locally generated error check bits based on the data, if the memory device is in self-refresh mode;

a comparator to compare the host generated error check bits with the locally generated error check bits; and an oscillator to control a self-refresh frequency, wherein the self-refresh frequency is to be set low enough to cause single bit errors in the data.

15. The system of claim 14, wherein the memory device further includes:

an oscillator to control a self-refresh frequency, wherein the self-refresh frequency is selected, at least in part, to allow single bit errors in the data.

16. The system of claim 15, wherein the memory device further includes:

error tracking logic to track errors in the data and to provide error information.

17. The system of claim 16, wherein the oscillator dynamically controls the self-refresh frequency based, at least in part, on the error information.

18. The system of claim 15, wherein the error tracking logic is to provide error information to a host.

19. The system of claim 18, wherein the oscillator dynamically controls the self-refresh frequency based, at least in part, on input from the host.

20. The system of claim 15, wherein the memory device further includes:

error correction logic to correct an error in the data if the host generated error check bits do not match the locally generated error check bits.

21. The system of claim 20, wherein the memory device further includes:

write logic to write corrected data to a memory core.

22. The system of claim 14, wherein the memory device further includes:

column address masking logic to provide a column address for the host generated error check bits to be stored in the second memory bank.

23. They system of claim 14, wherein the host comprises a memory controller.

24. The system of claim 14, wherein the memory device comprises a dynamic random access memory (DRAM).

* * * * *